United States Patent [19]
Lippens

[11] Patent Number: 5,904,966
[45] Date of Patent: May 18, 1999

[54] LAMINATED METAL STRUCTURE

[75] Inventor: Paul Lippens, Kortemark, Belgium

[73] Assignee: Innovative Sputtering Technology N.V. (I.S.T.), Belgium

[21] Appl. No.: 08/617,864

[22] PCT Filed: Sep. 23, 1994

[86] PCT No.: PCT/BE94/00059

§ 371 Date: Mar. 22, 1996

§ 102(e) Date: Mar. 22, 1996

[87] PCT Pub. No.: WO95/08438

PCT Pub. Date: Mar. 30, 1995

[30] Foreign Application Priority Data

Sep. 24, 1993 [BE] Belgium ............................. 9300999

[51] Int. Cl.$^6$ .............................. C23C 14/00; B22F 7/04
[52] U.S. Cl. .............. 428/36.91; 428/553; 428/557; 428/559; 428/560; 428/570; 428/567; 428/674; 428/675; 428/676; 428/677; 419/49; 419/68; 204/298.13; 204/298.2; 204/298.19; 204/298.21; 204/298.12; 204/298.28
[58] Field of Search .............. 419/49, 68; 505/432; 428/615, 553, 557, 559, 560, 570, 567, 674, 675, 676, 677, 36.91; 148/527, 530, 532; 204/298.13, 298.2, 298.19, 298.12, 299.28, 298.21

[56] References Cited

U.S. PATENT DOCUMENTS

| | | | |
|---|---|---|---|
| 3,755,887 | 9/1973 | Simoudis ............................. | 29/498 |
| 3,884,729 | 5/1975 | Jackson et al. ..................... | 148/11.5 A |
| 3,982,314 | 9/1976 | Ariga et al. ........................ | 29/527.4 |
| 4,065,302 | 12/1977 | Turillon ............................. | 75/208 R |
| 4,135,286 | 1/1979 | Wright et al. ...................... | 29/420 |
| 4,495,252 | 1/1985 | O'Brien ............................. | 428/555 |
| 4,514,470 | 4/1985 | Rosenthal et al. .................. | 428/662 |
| 4,526,839 | 7/1985 | Herman et al. ..................... | 428/550 |
| 4,578,320 | 3/1986 | Mahulikar et al. .................. | 428/674 |
| 4,596,746 | 6/1986 | Morishita et al. ................... | 428/458 |
| 4,605,599 | 8/1986 | Penrice et al. ..................... | 428/665 |
| 4,735,868 | 4/1988 | Robinson et al. ................... | 428/675 |
| 4,941,920 | 7/1990 | Inui et al. .......................... | 75/246 |
| 5,032,469 | 7/1991 | Merz et al. ........................ | 428/662 |
| 5,190,831 | 3/1993 | Banker .............................. | 428/660 |
| 5,213,904 | 5/1993 | Banker .............................. | 428/651 |
| 5,283,116 | 2/1994 | Tomari et al. ...................... | 428/323 |
| 5,383,985 | 1/1995 | Coulon .............................. | 148/527 |
| 5,435,965 | 7/1995 | Mashima et al. ................... | 419/8 |

FOREIGN PATENT DOCUMENTS

| | | |
|---|---|---|
| 0500031 | 8/1992 | European Pat. Off. . |
| 0522369 | 1/1993 | European Pat. Off. . |
| 03240940 | 10/1991 | Japan . |

*Primary Examiner*—Paul Thibodeau
*Assistant Examiner*—D. Lawrence Tarazano
*Attorney, Agent, or Firm*—Nixon & Vanderhye P.C.

[57] ABSTRACT

A laminated structure is obtained by hot isostatic pressing. The structure comprises a first metallic outer layer (produced by powder metallurgy) on one side, a second metallic outer layer on the other side which can form a brittle intermetallic phase and/or a brittle ordered phase with the first side, and a ductile metallic intermediate layer, the layers possessing mutually different coefficients of thermal expansion, whereby the intermediate layer acts as a diffusion barrier against the formation of the aforementioned brittle intermetallic phases or ordered phases. The invention also concerns a manufacturing method for the structure and an application of same as a cathode in a plasma sputtering unit.

15 Claims, 1 Drawing Sheet

LAMINATED METAL STRUCTURE

TECHNICAL FIELD OF THE INVENTION

The invention relates to a laminated structure comprising at least three metallic (i.e. metal containing) layers bonded to each other and which have mutually differing coefficients of thermal expansion. In an important embodiment one of the outer layers is manufactured from steel as a carrier or substrate layer for the laminated structure. The invention also comprises methods for the manufacture of the aforementioned structure and for its application or use as a cathode in plasma sputtering devices for coating objects with material from the boundary layer of the structure which is disposed at the opposite side of the substrate layer. For the purpose of this application, this boundary layer on the opposite surface will frequently possess a composition which is prepared in accordance with a powder metallurgical process.

SUMMARY OF THE INVENTION

Tubular rotatable cathodes with an outer target layer which can be deposited on other surfaces are known from U.S. Pat. No. 4,356,073, while tubular stationary cathodes with an inner target layer are known from U.S. Pat. No. 4,135,286. Flat cathodes are of course also known. In particular, from U.S. Pat. No. 3,992,202, the manufacture is known of a cylindrical laminate with a concentrically arranged steel outer layer, whereby the remaining annular space between outer layer and separation layer is filled with a powder metallurgical composition which is compacted using the hot isostatic pressing (HIP) process. A coefficient of thermal expansion has been chosen for the core which is greater than that of the other layers. During cooling following the HIP process the core therefore shrinks more than the other layers and thus separates from the hot-pressed powder layer at the location of the separation layer.

The purpose of the invention is among other things to prevent loosening, separating or pulling away the various layers at their boundary surfaces between the layers in flat or concentrically built-up tubular metal laminated structures as described hereinbefore. Particularly for use as cathodes in magnetrons the electrical and heat-conducting contact between the different layers of the laminate must be secure at all times, however great the mutual differences in their coefficients of expansion.

When using the usual cathodes—either flat or tubular—in cathodic sputtering or evaporation appliances, whereby the coefficient of thermal expansion of the carrier layer (e.g. made from a steel alloy) differs considerably from that of the target layer attached directly thereto, it has been shown that the shrinkage stresses (which occur during the cooling phase of the production process of the structure, for example in HIP processes) generate cracks in the target layer, more particularly if this layer is able to form a brittle intermetallic phase with the (steel) alloy in the boundary zone between the two layers and in particular when this target layer becomes relatively thin. This means that, in order to be able to guarantee sputtering target layers with a relatively constant composition, only partial sputtering of the target layer of cathodes constructed in this way is possible. Consequently these cathodes become unusable in practice while they still carry a relatively large residual thickness of target material which could in theory be used for sputtering. This is a loss factor which must not be underestimated, particularly where the target material is expensive.

This disadvantage inherent in the usual laminated cathodes, whether flat or tubular, is now avoided in accordance with the invention by providing a laminated structure, obtained by high isostatic pressing, and comprising a first metallic (i.e. metal containing) outer layer on one side, which is composed or produced by powder metallurgy, and a second metallic (i.e. metal containing) outer layer on the other side, of which metal elements can form one or more brittle intermetallic phases or structures and/or ordered brittle phases with the first layer. The laminated structure comprises further a ductile metallic intermediate layer, whereby the first, second and intermediate layers possess mutually differing coefficients of thermal expansion and whereby the intermediate layer acts as a diffusion barrier against the formation of the aforementioned brittle intermetallic phases or ordered phases. The first outer layer referred to will preferably be at least three times as thick as the intermediate layer.

The outer layer on the other side is, for example, an alloy steel layer and will preferably be a stainless steel, e.g. from the 300 series. If the first outer layer is a cobalt-rich alloy and the outer layer on the other side—i.e. the carrier layer—is made of stainless steel, then inter alia an intermediate layer of at least 95% by weight copper and nickel (together) has been found to be suitable to avoid the formation of cracks as a result of shrinkage stresses in the laminated or layered structure.

The invention also relates to a method for the manufacture of the laminated structure whereby a metallic substrate-forming outer layer is covered with the metallic intermediate layer and whereby an outer layer coating of a powder-metallurgically prepared composition is subsequently bonded to the intermediate layer by means of hot isostatic pressing (HIP process). The intermediate layer can if required be compacted before the application of the outer layer coating referred to. The intermediate layer will preferably comprise at least two sublayers which partially diffuse into each other during the HIP-process.

These matters will now be explained in more detail with reference to a number of embodiments of the invention and to the accompanying drawings. Additional details and advantages will also be discussed.

BRIEF DESCRIPTION OF THE DRAWING FIGURES

DESCRIPTION OF THE PREFERRED EMBODIMENTS

Figure 1:
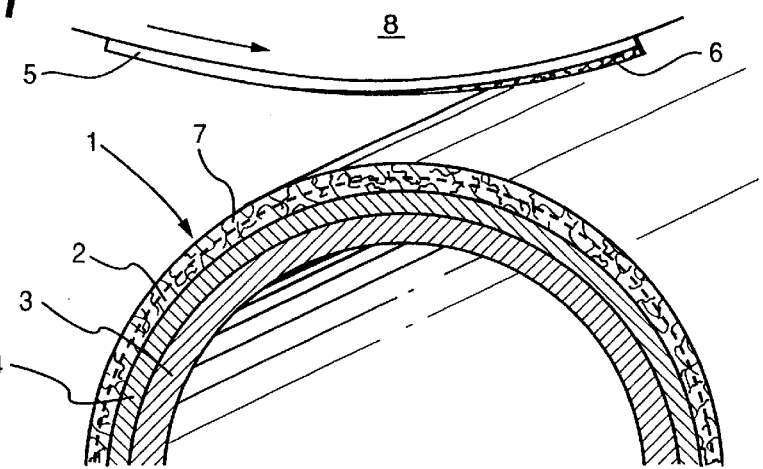
FIG. 1 shows a partial section of a tubular laminated metallic structure in accordance with the invention with the carrier layer as the inner lining.

The tubular laminated metallic structure 1 sketched in FIG. 1 comprises a metallic inner lining or inner sleeve 3 as a carrier layer, e.g. from stainless steel, and a metallic outer layer or outer sleeve 2, e.g. from a powder-metallurgically prepared alloy. These two layers possess differing coefficients of thermal expansion. The thickness of the carrier layer 3 can be, for example, 1 cm. The thickness of the intermediate layer 4 is quite thin, for example less than 1 mm. This is sufficient for the formation of an adequate diffusion barrier against the formation of brittle phases between, e.g., the iron from the stainless steel layer 3 and the cobalt from a cobalt alloy layer 2, in particular a layer rich in cobalt. This thickness is also adequate to bridge the shrinkage stresses between the layer with the higher coefficient of thermal expansion (steel) and that with a lower coefficient (cobalt) on the condition that the material of the intermediate layer 4 is sufficiently ductile. In concrete terms this means that the metallic intermediate layer 4 may possess a yield point to tensile strength ratio which lies between ¼ and ⅔. Copper-nickel compositions with, e.g., a global (average) weight ratio of copper to nickel+copper of between 10% and 90%, and in particular between 40% and 70%, are suitable. In this intermediate layer 4 copper and nickel will usually be mixed at least partially in a solid solution. This means that the intermediate layer 4 can be richer in nickel near to the layer 3 and richer in copper near to the outer layer 2, in particular when the layer 2 is a cobalt alloy and the layer 3 is a steel alloy layer. The average expansion coefficient of this copper-nickel intermediate layer 4 lies between that of the cobalt alloy and that of the steel alloy.

The layer 2 can consist of a cobalt alloy which contains boron. In this case the aforementioned laminated structure can be used: steel layer 3, intermediate layer 4 with consecutively a boundary nickel film adjacent to the steel, nickel-copper alloy layers with increasing concentration of copper as a transition to a copper boundary layer adjacent to the cobalt alloy layer 2. This structure will now at the same time prevent that boron diffuses to the steel layer during the manufacture or use of the laminated structure. This is important, as will become apparent from the example hereinafter. The composition of the ductile intermediate layer can thus in general be adapted in such a way that it simultaneously forms a barrier against unwanted diffusions of elements from layer 2 to layer 3 and/or vice versa.

For certain specific applications the cobalt alloy can also contain Si, Fe and possibly Mo. The Fe Ni Mo B-alloys, Terfenol and other alloy compositions enumerated in U.S. Pat. Nos. 4,510,490 (table 1) and 4,581,524, as well as Co-alloys, in particular binary Co-alloys, with less than 22% at Cr can be choosen as target layer 2 for sputtering thin layers with specific magnetic characteristics.

Figure 2:
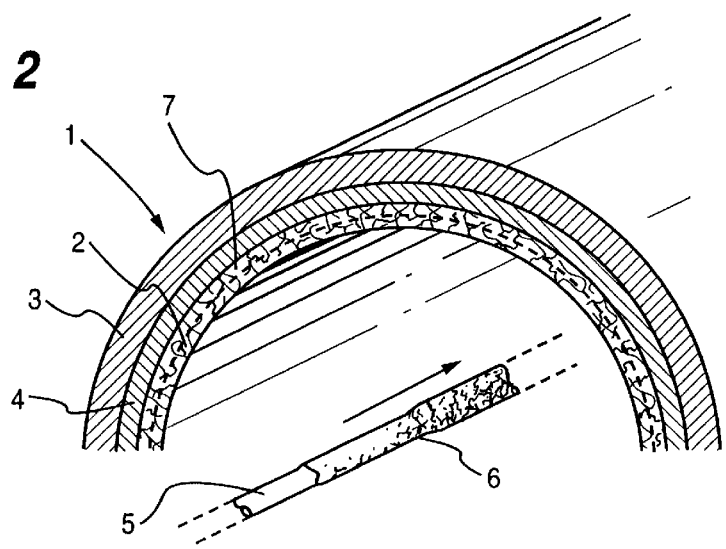
FIG. 2 shows a similar partial section to that in FIG. 1 but with the carrier layer as the outer sleeve.

In a converse embodiment to that depicted in FIG. 1, the invention also provides for a laminated tubular structure as shown in FIG. 2 whereby the so-called first outer layer 2 forms the inner lining of the tube and the so-called second outer layer 3 forms the outer sleeve.

The laminated metallic structures in accordance with the invention have an important application as sputtering electrodes 1 in cathodic evaporation devices. The tubular cathode 1 shown in FIG. 1, can be used e.g. as a rotatable cathode in a device described in U.S. Pat. No. 4,356,073 whereby material is sputtered off from the outer layer 2 and deposited as a layer 6 on a film (or plate) substrate 5 which is fed continuously through the device or apparatus around a drum 8 facing the outer surface(s) of one or more of the aforementioned tubes 1. Polyester films are often used as a substrate 5. The composition of the aforementioned outer layer (or layers) 2 will naturally have to be adjusted for the desired covering layer composition on the film. There is presently a high demand for all kinds of covering layer compositions with specific physico-chemical, magnetic, optical and/or electrical characteristics for use, for example, in semi-conductors, magnetic registration, to meet absorption, reflection or transmission requirements for electromagnetic radiation at various ranges of frequencies, for surface hardness, abrasion resistance, gas tight surfaces, etc. In general, therefore, specific alloys can be sputtered off as such from the outer layers 2 in a highly diluted inert gas atmosphere (argon). On the other hand, via reactive sputtering in a nitrogen, respectively oxygen or other diluted gas atmosphere, a nitride, respectively oxide or other compound with the desired composition can be deposited from the layer 2 onto the substrate 5. Combinations of consecutive reactive and non-reactive sputtering are also possible.

Conversely, an elongated substrate 5, such as a wire, filament bundle, elongated profiled section, strip or cable can be fed axially through the inside space of the tubular cathode 1 in accordance with FIG. 2, whereby material 6 from the layer 2, which is present as an inner lining can be deposited continuously on this substrate 5 by means of sputtering. If required an object 5 can also be arranged in a stationary position in the aforementioned inside space and coated in that position by sputtering with a covering layer 6.

Figure 3:
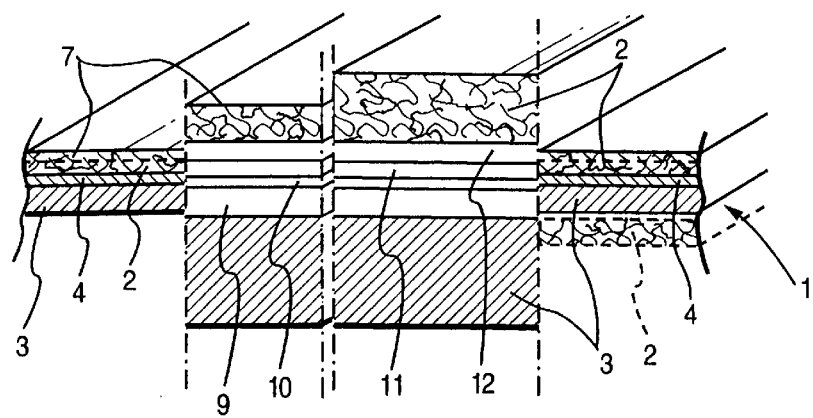
FIG. 3 shows a laminated metallic structure in accordance with the invention in the form or shape of a flat plate.

Naturally the substrates 5 to be covered can also be fed past flat cathodes 1 in accordance with FIG. 3 with specific outer layer compositions 2 to be deposited by sputtering.

As the metallic covering layer compositions 6 can be fairly complex, the outer layers 2 will generally have to be prepared by means of powder metallurgical techniques. It is extremely important that the layers 2 are bonded very securely to the carrier layer 4 so as to ensure a uniform electrical or heat-conducting surface contact. During sputtering the cathode heats up and must be capable of being continuously and evenly cooled. The layer 2 itself must also be perfectly compacted. This can be achieved by bonding the carrier layer 3 and the target layer 2 to each other by means of so-called hot isostatic pressing (HIP process). If necessary the HIP process can be preceded by a cold isostatic pressing (CIP) process. If the layers 2 and 3 possess significantly differing expansion coefficients, strong shrinkage stresses will arise, as stated hereinbefore, during the cooling process following the application of the HIP process, in the boundary area between these layers 2 and 3, which stresses have to be accommodated by the intermediate layer 4.

EXAMPLE

As a carrier layer 3 for a rotatable tubular cathode 1 in accordance with FIG. 1, a stainless steel tube was used. This was coated with a thin nickel layer (as a first intermediate sublayer) and thereafter with a thin copper layer (as a second intermediate sublayer). The tube, thus coated, was then placed concentrically in a cylindrical steel vessel and the annular intermediate region between the copper surface and the steel inner wall of the vessel was filled up with a cobalt alloy prepared using powder metallurgy. The whole assembly was compacted in the usual manner using hot isostatic pressing in a reducing atmosphere at temperatures above 900° C. and thereafter cooled. During the HIP-process the nickel and copper sublayers diffused into each other in their contact area to form a set of layers 9 to 12 described above.

The layer 2 had a magnetic composition analogous to that which is known from European Patent Application no. 0295028. The intermediate layer displayed a gradual transition from nickel adjacent to the steel sleeve, through nickel-copper alloys (monel, cupronickel) to copper adjacent to the layer 2. The average proportion of copper to nickel+copper was 55%. With this intermediate layer 4 a sufficiently ductile intermediate layer was realised with a yield point/tensile strength ratio lying between ¼ and ⅔ in order to be able to adequately accommodate the shrinkage stresses occurring during cooling: no cracks occurred in the laminated structure.

At the same time it was now established that the copper/nickel layer 4 was able to combat and prevent the formation of a brittle ordered Co—Fe phase during the HIP process and that at the same time diffusion of boron from the cobalt alloy to the nickel in the intermediate layer (with formation of nickel borides) and to the chromium in the stainless steel layer (with formation of chromium borides) could be prevented. The diffusion of boron, among other things, from the cobalt alloy must be avoided at all costs since the composition of the target layer could change as the layer 2 becomes thinner. Moreover, the formation of chromium bromides, in particular, must be avoided since these form a very brittle phase.

When applying this tube as a rotatable cathode in a magnetron sputtering appliance, sputtering can take place without problems down to a thickness 7 of only half a millimeter. A cathode which has been used in this way can be coated once again using the HIP process as described hereinbefore with the same cobalt-rich target alloy.

The copper and nickel layers can be applied as film or by means of electrolysis or by means of plasma jet and if required can be compacted onto the carrier layer 3 by means of a rolling treatment in order to prevent internal oxidation of any pores which may be present in the layer 4 before or during the application of the powder alloy layer 2. FIG. 3 presents a schematic illustration of a laminated structure within the copper/nickel intermediate layer 4 of a flat cathode 1. A nickel layer 9 with a very low concentration of copper rests against the stainless steel layer 3. Via monel layers 10, the alloy layer changes in composition to successive layers of cupronickel 11 with decreasing nickel concentration until the copper layer 12 is reached to which the powder alloy layer 2 is joined.

As suggested by the dotted line in the right-hand half of FIG. 3, the flat carrier 3 for the cathode material 2 to be sputtered can if required be coated on both sides with an intermediate layer 4 to which an alloy layer 2 is then applied. In this way the flat electrode can be used double-sidedly. The composition of the alloy layer 2 on the one side may differ from that on the other (opposite) side.

The invention is not limited to a combination of a cobalt alloy on a steel carrier layer. The use of, for example, copper or aluminium carrier layers 3 is feasible and the so-called alloy layer 2 can if required be formed on the basis of B, Si, C and other solid elements of group IA to VIA, VIII or IB to VIIB.

In particular in the case of cobalt alloys, the invention is especially suitable for the preparation of cathodes for the deposition on substrates 5 of soft magnetic layers based on Co—Nb—Zr alloys. Hard magnetic alloys (for magnetic registration) can also be applied, such as Co—P, Co—Cr, Co—Ni, Co—Pt, Co—Cr—Ni, Co—Cr—Ta, Co—Ni—P and Co—Cr—Pt. Finally, alloy layers can also be composed for magnetic optical applications, for example on the basis of Co—Pd or Co—Pt, Co—Fe—Gd or Co—Fe—Tb.

When compositions with high magnetic permeability have to be deposited by sputtering from relatively thick target layers (outer layers 2), then it is difficult to obtain sufficient leakage magnetic flux for generating a plasma. One solution thereto is to design for the target material a mixture of powders each with compositions which have a low permeability but whereby the overall composition of the target material has the right proportions to deposit the desired composition of the layer with high permeability.

We claim:

1. A laminated structure obtained by hot isostatic pressing in a reducing atmosphere at temperatures above 900° C. and having first and second opposite sides, comprising:
   a first powder metalurgically produced metallic outer layer on said first side which consists essentially of a cobalt alloy or an alloy which includes iron, nickel, molybdenum and boron;
   a second metallic outer layer on said second side which consists essentially of a steel, aluminum or copper alloy; and
   a ductile metallic intermediate layer consisting of at least 95% copper and nickel by weight and disposed intermediate said first and second outer layers, wherein
   said first, second and intermediate layers have different coefficients of thermal expansion relative to one another, and wherein
   said intermediate layer has a yield point/tensile strength ratio between ¼ and ⅔, and acts as a diffusion barrier against the formation in any of the layers of a brittle intermetallic phase and/or an ordered phase comprised of constituents of said first and/or second layers.

2. A structure in accordance with claim 1, wherein an average weight ratio of copper/copper+nickel in said intermediate layer lies between 10% and 90%.

3. A structure in accordance with claim 2, wherein said intermediate layer contains more nickel than copper adjacent the second outer layer and contains more copper than nickel adjacent the first outer layer.

4. A structure in accordance with claim 1, wherein said first outer layer is at least three times as thick as said intermediate layer.

5. A structure in accordance with claim 1, wherein the thickness of the intermediate layer is less than 1 mm.

6. A structure in accordance with claim 1, wherein the first outer layer is a cobalt alloy which contains boron.

7. A structure in accordance with claim 1, wherein the first outer layer is a cobalt alloy which also contains Si and Fe.

8. A structure in accordance with claim 1, wherein the first outer layer is a binary Co-alloy containing less than 22% Cr.

9. A structure in accordance with claim 1, in the form of a tube wherein said first outer layer forms an outer sleeve of said tube and said second outer layer forms an inner lining of said tube.

10. A structure in accordance with claim 1, in the form of a tube wherein said first outer layer forms an inner lining of said tube and said second outer layer forms an outer sleeve of said tube.

11. A structure in accordance with claim 1, in the form of a flat plate.

12. A rotatable cathode in a plasma sputtering unit for covering substrates with material from said outer layer, the cathode comprising the structure of claim 10.

13. A stationary tubular cathode in a plasma sputtering unit for coating substrates with material from said outer layer, the cathode comprising the structure of claims 10.

14. A flat cathode in a plasma sputtering unit for coating substrates with material from said outer layer, the cathode comprising the structure of claim 11.

15. A structure in accordance with claim 3, wherein the first outer layer is formed of a cobalt alloy and the second outer layer is formed of a stainless steel.

* * * * *